US010950617B2

(12) United States Patent
Takekida

(10) Patent No.: US 10,950,617 B2
(45) Date of Patent: Mar. 16, 2021

(54) MEMORY DEVICE WITH MULTIPLE LAYERS

(71) Applicant: TOSHIBA MEMORY CORPORATION, Tokyo (JP)

(72) Inventor: Hideto Takekida, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/109,365

(22) Filed: Aug. 22, 2018

(65) Prior Publication Data
US 2019/0287988 A1 Sep. 19, 2019

(30) Foreign Application Priority Data

Mar. 13, 2018 (JP) .............................. JP2018-045645

(51) Int. Cl.
*H01L 27/11582* (2017.01)
*H01L 27/11524* (2017.01)
(Continued)

(52) U.S. Cl.
CPC .... *H01L 27/11582* (2013.01); *G11C 16/0483* (2013.01); *G11C 16/08* (2013.01);
(Continued)

(58) Field of Classification Search
CPC ......... H01L 27/11582; H01L 21/02164; H01L 21/02532; H01L 21/02592;
(Continued)

(56) References Cited

U.S. PATENT DOCUMENTS 7,301,815 B2 * 11/2007 Kurata ..................... G11C 8/14
365/185.2
7,884,417 B2 * 2/2011 Mizukami ................ G11C 5/02
257/324

(Continued)

OTHER PUBLICATIONS

Handy, Jim, 64-Layer 3D NAND Chips Revealed at ISSCC, The Memory Guy Covering Everything about Memory Chips, thememoryguy.com, 11 Februaruy 2017, retrieved on Jun. 20, 2019 <URL: https://thememoryguy.com/64-layer-3d-nand-chips-revealed-at-isscc/#nnore-1483> (Year: 2017).*

*Primary Examiner* — Richard Elms
*Assistant Examiner* — R Lance Reidlinger
(74) *Attorney, Agent, or Firm* — Kim & Stewart LLP

(57) ABSTRACT

A memory device includes a plurality of word lines spaced from one another in a first direction, a first insulating film provided between adjacent word lines, a plurality of select gates located above the plurality of word lines in the first direction, a first intermediate electrode provided between the plurality of word lines and the select gates, a second insulating film provided between the first intermediate electrode and the select gates, a semiconductor pillar extending through the plurality of word lines, the first insulating film, the first intermediate electrode, the second insulating film, and the select gates, and extending in the first direction, and a charge retention film located between each of the plurality of word lines and the semiconductor pillar, wherein the second insulating film has a second thickness in the first direction that is greater than a first thickness of the first insulating film in the first direction.

13 Claims, 9 Drawing Sheets

(51) Int. Cl.
*H01L 29/10* (2006.01)
*G11C 16/08* (2006.01)
*G11C 16/24* (2006.01)
*G11C 16/04* (2006.01)
*H01L 27/11556* (2017.01)
*H01L 27/1157* (2017.01)
*H01L 23/528* (2006.01)
*H01L 21/02* (2006.01)
*H01L 21/311* (2006.01)
*H01L 21/28* (2006.01)

(52) U.S. Cl.
CPC ............ *G11C 16/24* (2013.01); *H01L 23/528* (2013.01); *H01L 27/1157* (2013.01); *H01L 27/11524* (2013.01); *H01L 27/11556* (2013.01); *H01L 29/1037* (2013.01); *H01L 21/0262* (2013.01); *H01L 21/02164* (2013.01); *H01L 21/02532* (2013.01); *H01L 21/02592* (2013.01); *H01L 21/02595* (2013.01); *H01L 21/02667* (2013.01); *H01L 21/31116* (2013.01); *H01L 29/40114* (2019.08); *H01L 29/40117* (2019.08)

(58) Field of Classification Search
CPC ........... H01L 21/02595; H01L 21/0262; H01L 21/02667; H01L 21/31116; H01L 23/528; H01L 27/11519; H01L 27/11524; H01L 27/11556; H01L 27/11565; H01L 27/27; H01L 27/1157; H01L 29/1037; H01L 29/40114; H01L 29/40117; G11C 16/0483; G11C 16/08; G11C 16/10; G11C 16/24

See application file for complete search history.

(56) References Cited

U.S. PATENT DOCUMENTS

| | | | | |
|---|---|---|---|---|
| 7,936,004 | B2 | 5/2011 | Kito et al. | |
| 8,045,383 | B2* | 10/2011 | Sel | G11C 16/3427 |
| | | | | 365/185.17 |
| 8,294,191 | B2* | 10/2012 | Katsumata | H01L 27/1157 |
| | | | | 257/314 |
| 8,446,780 | B2* | 5/2013 | Iwai | G11C 16/0483 |
| | | | | 365/185.17 |
| 8,569,826 | B2* | 10/2013 | Kidoh | H01L 27/11573 |
| | | | | 257/324 |
| 9,496,038 | B1* | 11/2016 | Kwak | G11C 16/0483 |
| 2016/0343450 | A1* | 11/2016 | Lee | H01L 27/11556 |

* cited by examiner

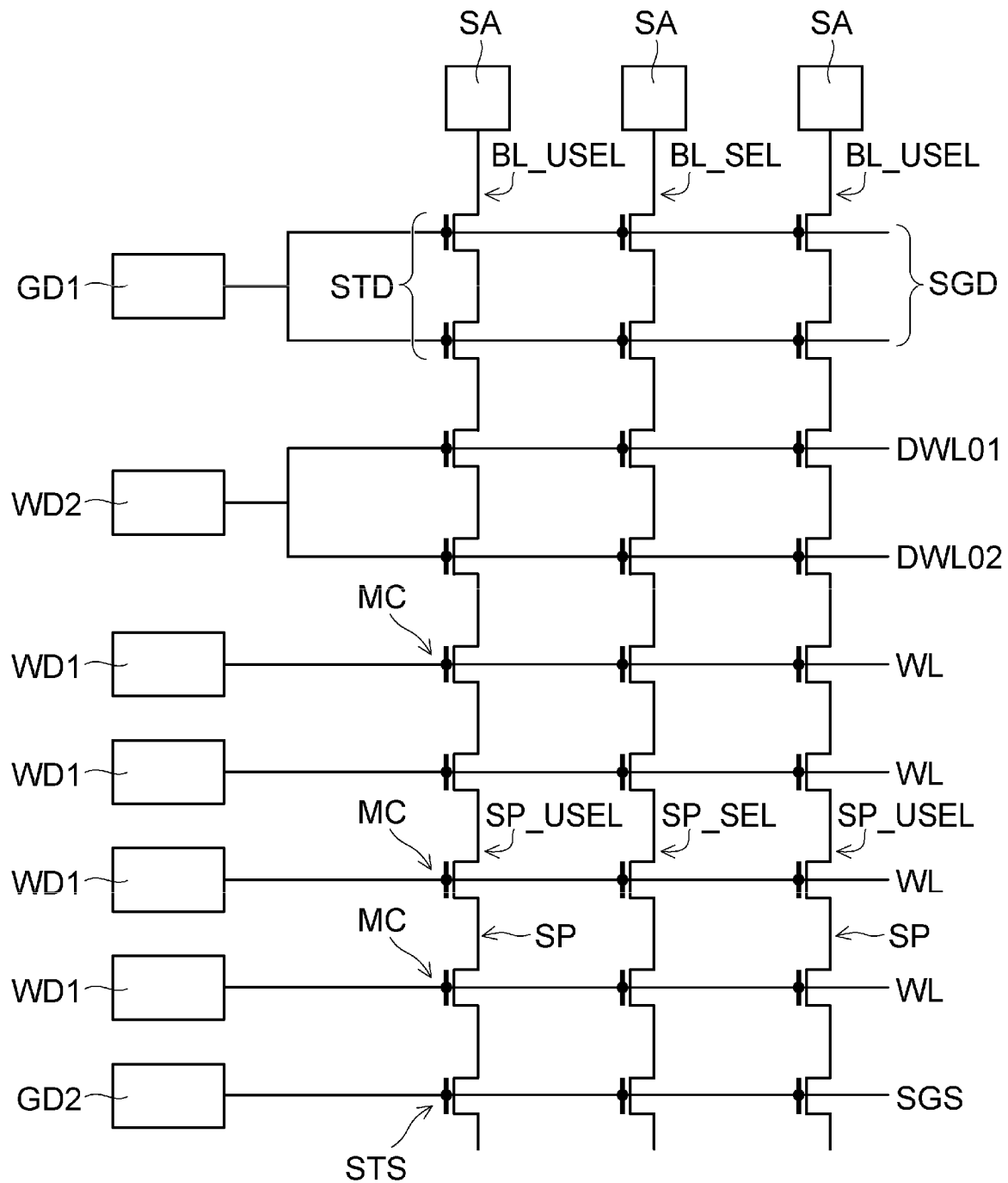

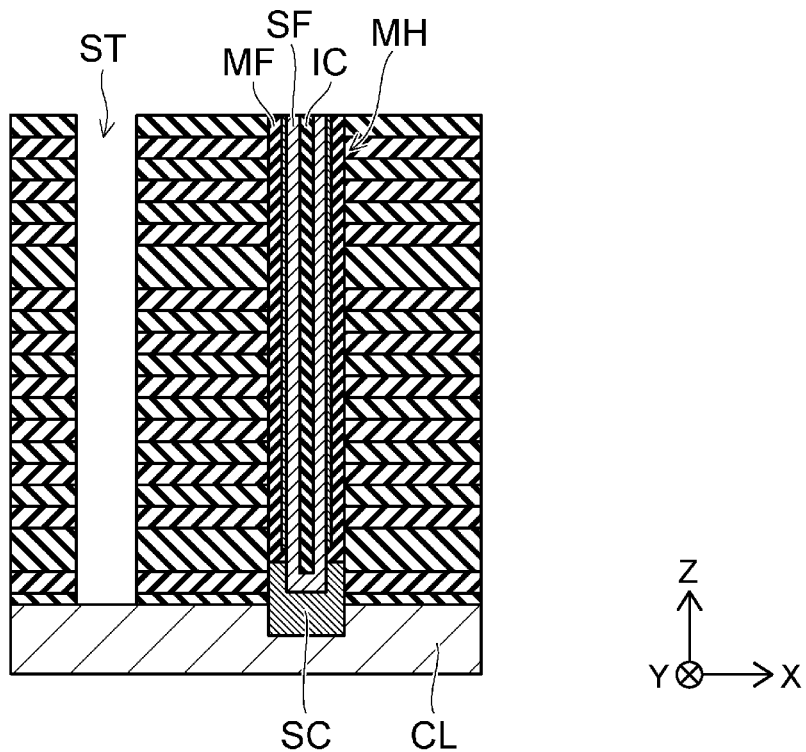
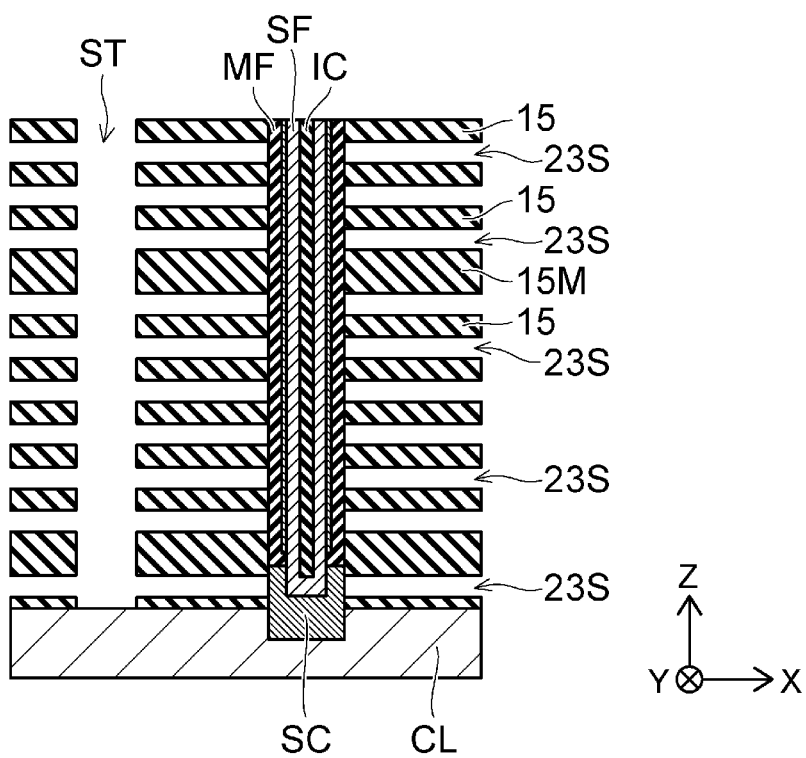

US 10,950,617 B2

MEMORY DEVICE WITH MULTIPLE LAYERS

CROSS-REFERENCE TO RELATED APPLICATION

This application is based upon and claims the benefit of priority from Japanese Patent Application No. 2018-045645, filed Mar. 13, 2018, the entire contents of which are incorporated herein by reference.

FIELD

Embodiments described herein relate generally to a memory device.

BACKGROUND

Development of memory devices including memory cells arranged in three dimensions is ongoing. For example, in a NAND-type nonvolatile memory device, a plurality of word lines and a plurality of select gates are stacked with intervening interlayer insulating films and semiconductor pillars penetrating the word lines and the select gates in the layer stacking direction are provided. Memory cells are disposed at location where the semiconductor pillars intersect the plurality of word lines. To increase the memory capacity of such a semiconductor device, it is effective to make thinner the word lines, the select gates, and the interlayer insulating films and to increase the number of the stacked word lines. However, making the word lines and the select gates thinner increases parasitic resistances of the word lines and the select gates and making the interlayer insulating films thinner increases parasitic capacitances. This often causes malfunctioning of the memory cells.

DESCRIPTION OF THE DRAWINGS

FIG. 3 is a block diagram illustrating a configuration of the memory device according to the embodiment.

FIGS. 8A and 8B are schematic diagrams illustrating procedures, subsequent to those of FIGS. 7A and 7B, of manufacturing the memory device according to the embodiment.

DETAILED DESCRIPTION

Figure 1:
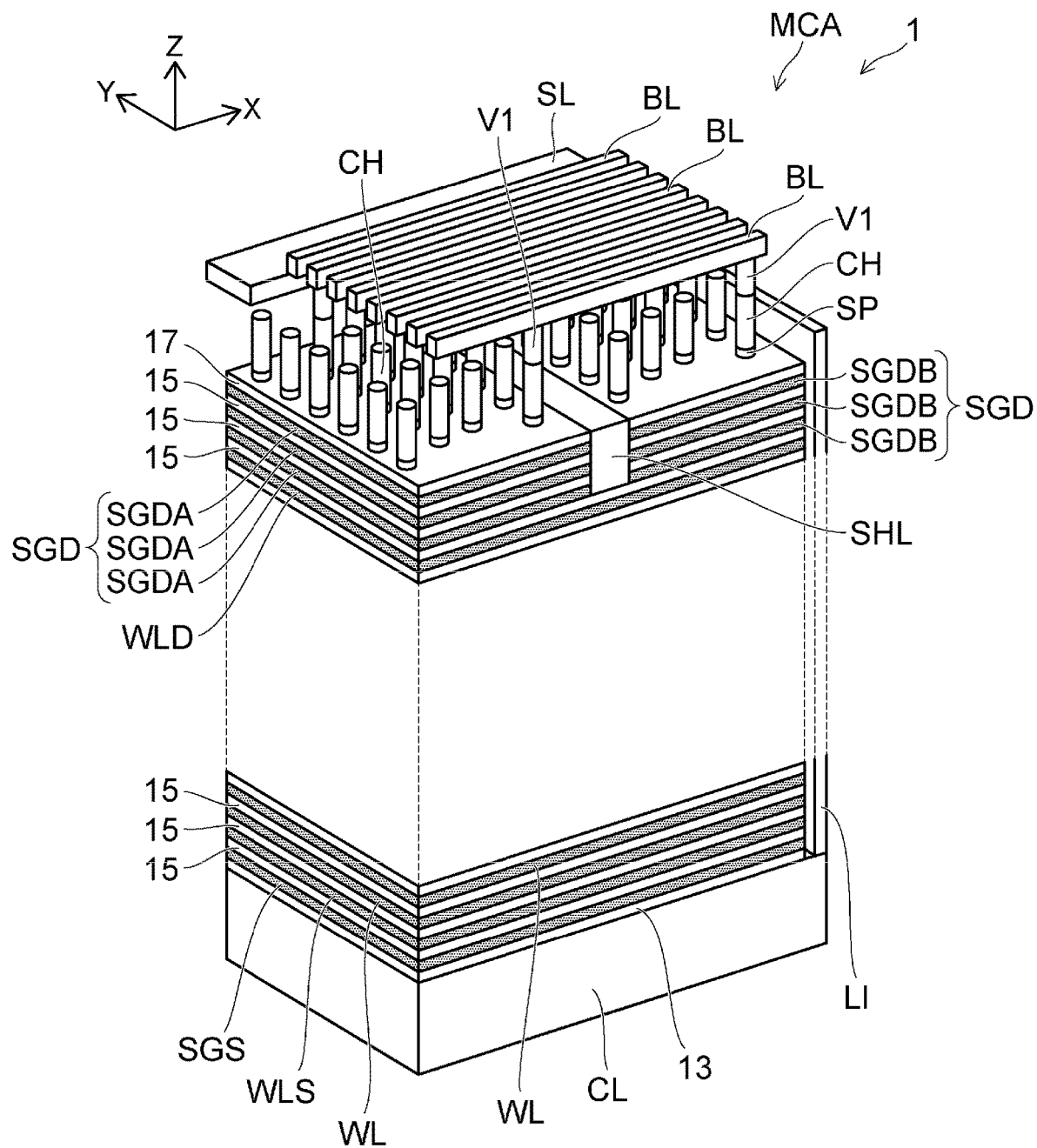
FIG. 1 is a perspective view schematically illustrating a memory device according to an embodiment.

An embodiment provides a memory device that can prevent malfunctioning of memory cells.

In general, according to one embodiment, a memory device includes a plurality of word lines spaced from one another in a first direction, a first insulating film provided between the word lines adjacent to each other in the first direction, a plurality of select gates located above the plurality of word lines in the first direction, a first intermediate electrode provided between the plurality of word lines and the select gates, a second insulating film provided between the first intermediate electrode and the select gates, a semiconductor pillar extending through the plurality of word lines, the first insulating film, the first intermediate electrode, the second insulating film, and the select gates, and extending in the first direction, and a charge retention film located between each of the plurality of word lines and the semiconductor pillar. The second insulating film has a second thickness in the first direction that is greater than a first thickness of the first insulating film in the first direction.

Embodiments will be described hereinafter with reference to the drawings. In the drawings, the same sections are denoted by the same reference signs and detailed description of the same sections is omitted as appropriate, while different sections will be described. It is noted that the drawings are either schematic or conceptual and the relationship between a thickness and a width of each section, a proportion of magnitudes of sections, and the like are not necessarily identical to actual ones. Furthermore, even the same sections are often depicted at different sizes or different proportions depending on the drawings.

Moreover, arrangement and a configuration of each section will be described using an X-axis, a Y-axis, and a Z-axis shown in the drawings. The X-axis, the Y-axis, and the Z-axis are orthogonal to one another and represent an X direction, a Y direction, and a Z direction, respectively. Furthermore, the description is often given while assuming that the Z direction is upward and an opposite direction to the Z direction is downward.

FIG. 1 is a perspective view schematically illustrating a memory device 1 according to an embodiment. The memory device 1 is, for example, a NAND-type nonvolatile memory device and it includes a memory cell array MCA. In FIG. 1, portions of the insulating films are omitted for illustrating a configuration of the memory cell array MCA.

The memory cell array MCA includes a conductive layer CL, a plurality of electrode layers, and interlayer insulating films 13, 15, and 17. The conductive layer CL is, for example, a P-type well provided in a silicon substrate (not shown) or in a semiconductor layer provided on the silicon substrate over an intervening interlayer insulating film. The plurality of electrode layers are stacked over the conductive layer CL and include, for example, a select gate SGS, a plurality of word lines WL, and a select gate SGD.

The plurality of electrode layers also include dummy word lines WLS and WLD. The dummy word line WLS is provided between the select gate SGS and the word line WL proximate to the select gate SGS. The dummy word line WLD is provided between the select gate SGD and the word line WL proximate to the select gate SGD.

As shown in FIG. 1, the select gate SGD is divided into a plurality of select gates SGDA and a plurality of select gates SGDB by an isolation groove SHL. The select gates SGDA and the select gates SGDB are stacked on the word lines WL.

The interlayer insulating film 13 is provided between the conductive layer CL and the select gate SGS. The interlayer insulating films 15 are each provided between each two electrode layers adjacent to each other in the Z direction. The interlayer insulating film 17 is provided on the select gate SGD.

The memory cell array MCA further includes a plurality of semiconductor pillars SP. The semiconductor pillars SP penetrate the word lines WL and the select gate SGD and extend in the Z direction (refer to FIG. 2).

The memory device 1 further includes bit lines BL and a source line SL provided above the memory cell array MCA. The semiconductor pillars SP are each electrically connected to one bit lines BL via connection plugs CH and V1. The source line SL is electrically connected to the conductive layer CL via, for example, a connection conductor LI. The connection conductor LI is, for example, a plate-like conductor provided on a lateral side of the memory cell array MCA.

Figure 2:
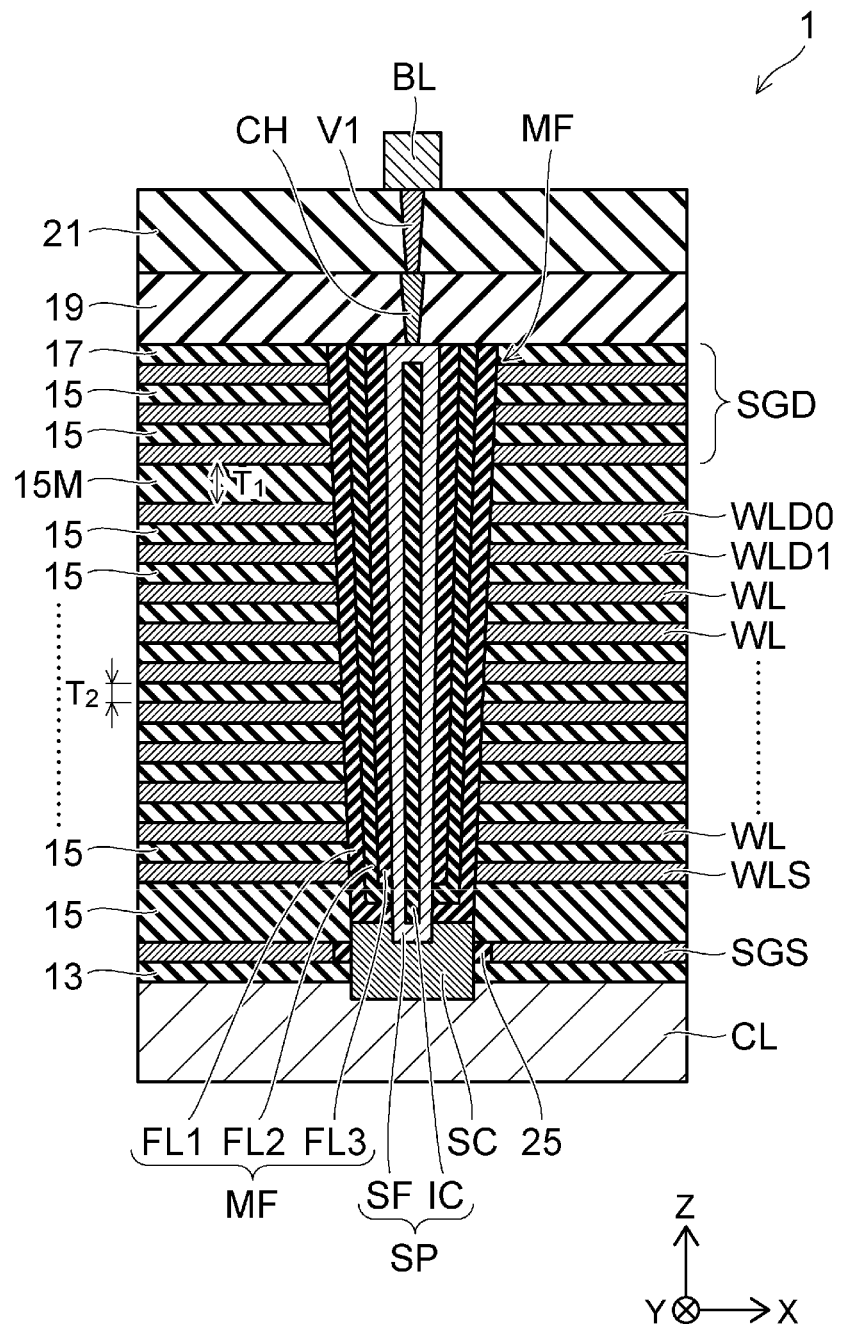
FIG. 2 is a partial cross-sectional view schematically illustrating the memory device according to the embodiment.

FIG. 2 is a partial cross-sectional view schematically illustrating a portion of the memory device 1 according to the embodiment. FIG. 2 is a schematic diagram illustrating configurations of a memory hole MH including the semiconductor pillar and the electrode layers.

As shown in FIG. 2, the semiconductor pillar SP is provided within the memory hole MH (refer to FIG. 6B) penetrating the word lines WL and the select gate SGD and it extends in the Z direction. The semiconductor pillar SP includes a semiconductor film SF and an insulating core IC. The insulating core IC is, for example, silicon oxide and extends in the Z direction within the memory hole MH. The semiconductor film SF is, for example, a polysilicon film and provided to cover the insulating core IC.

The semiconductor pillar SP is connected to a single bit line BL via the connection plugs CH and V1. Specifically, the connection plug CH is connected to the semiconductor film SF on an upper end of the semiconductor pillar SP. On the other hand, a semiconductor layer SC is provided between a lower end of the semiconductor pillar SP and the conductive layer CL. The semiconductor layer SC extends through the select gate SGS. The lower end of the semiconductor layer SC is connected to the conductive layer CL and an upper end thereof is connected to the semiconductor pillar SP. Furthermore, an insulating film 25 is provided between the semiconductor layer SC and the adjacent portion of the select gate SGS.

Moreover, a memory film MF is provided within the memory hole MH. The memory film MF is provided between the semiconductor pillar SP and the inner wall of the memory hole MH. The memory film MF includes, for example, a block insulating film FL1, a charge retention film FL2, and a tunnel insulating film FL3. The block insulating film FL1, the charge retention film FL2, and the tunnel insulating film FL3 are stacked in order on the inner wall of the memory hole MH.

As shown in FIG. 2, dummy word lines WLD0 and WLD1 are disposed between the select gate SGD and the uppermost word line WL. The dummy word line WLD0 is disposed between the select gate SGD and the dummy word line WLD1.

In the memory device 1 according to the present embodiment, an interlayer insulating film 15M is provided between the select gate SGD and the dummy word line WLD0. The interlayer insulating film 15M contains the same material as, for example, that of the interlayer insulating films 15 provided between the word lines WL adjacent in the Z direction. The interlayer insulating film 15M is, for example, a silicon oxide film. Furthermore, the interlayer insulating film 15M is formed to have a thickness $T_2$ in the Z direction that is larger than a thickness $T_1$ of the interlayer insulating films 15 in the Z direction.

FIG. 3 is an electrical schematic diagram illustrating a configuration of the memory device according to the embodiment. The word lines WL are each connected to, for example, a drive circuit WD1. The dummy word lines WLD0 and WLD1 are connected to a common drive circuit WD2. The select gates SGD and SGS are connected to drive circuits GD1 and GD2, respectively. The drive circuits WD1, WD2, GD1 and GD2 are connected to a voltage source (not shown), and selectively supply a voltage to the string or strings of select gate transistors or memory cells connected thereto. Furthermore, the semiconductor pillars SP are each connected to a sense amplifier SA via the bit line BL.

As shown in FIG. 3, a memory cell MC is disposed at the location where each semiconductor pillar SP intersects each word line WL. The memory cell MC includes part of the memory film MF located between the semiconductor pillar SP and the word line WL as a charge retention section.

A select transistor STD is provided at the location where each semiconductor pillar SP intersects the select gate SGD. The select transistor STD includes part of the memory film MF located, for example, between the semiconductor pillar SP and the select gate SGD as a gate insulating film. Moreover, a select transistor STS is provided at the location where the select gate SGS intersects the semiconductor layer SC. The select transistor STS includes the insulating film 25 located between the semiconductor layer SC and the select gate SGS as a gate insulating film (refer to FIG. 2).

Figure 4A:
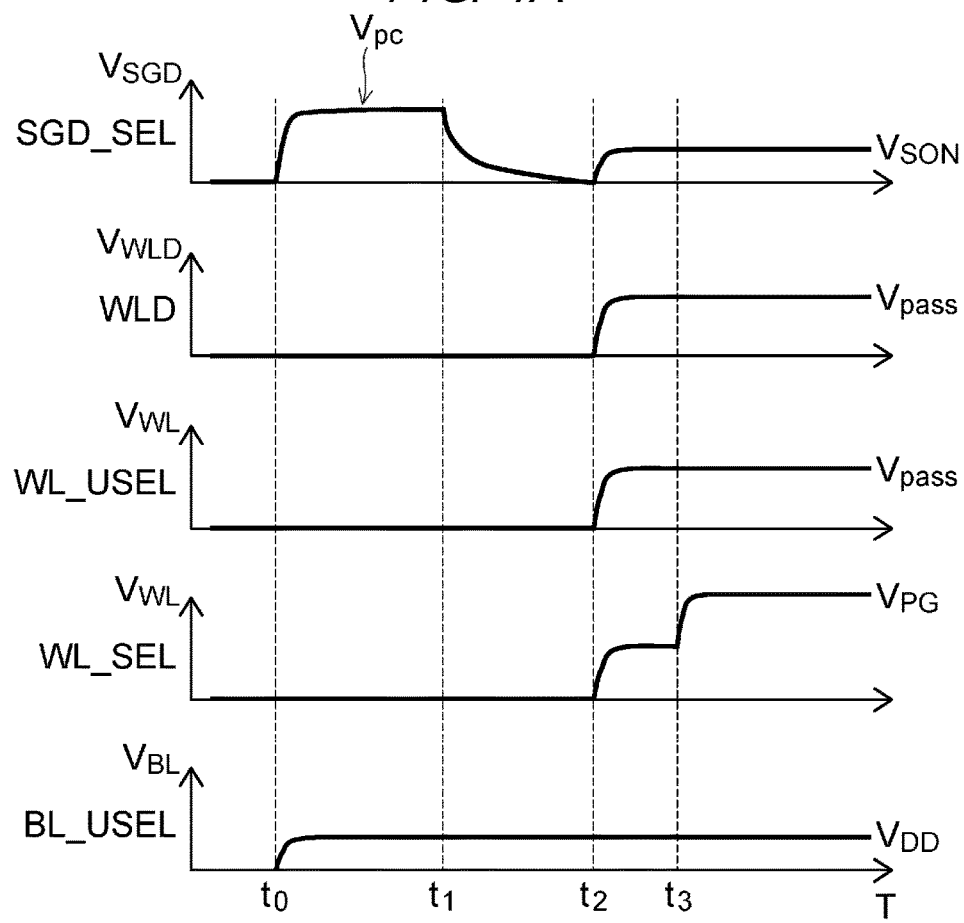
FIGS. 4A and 4B are time charts illustrating operation of the memory device according to the embodiment.
Figure 4B:
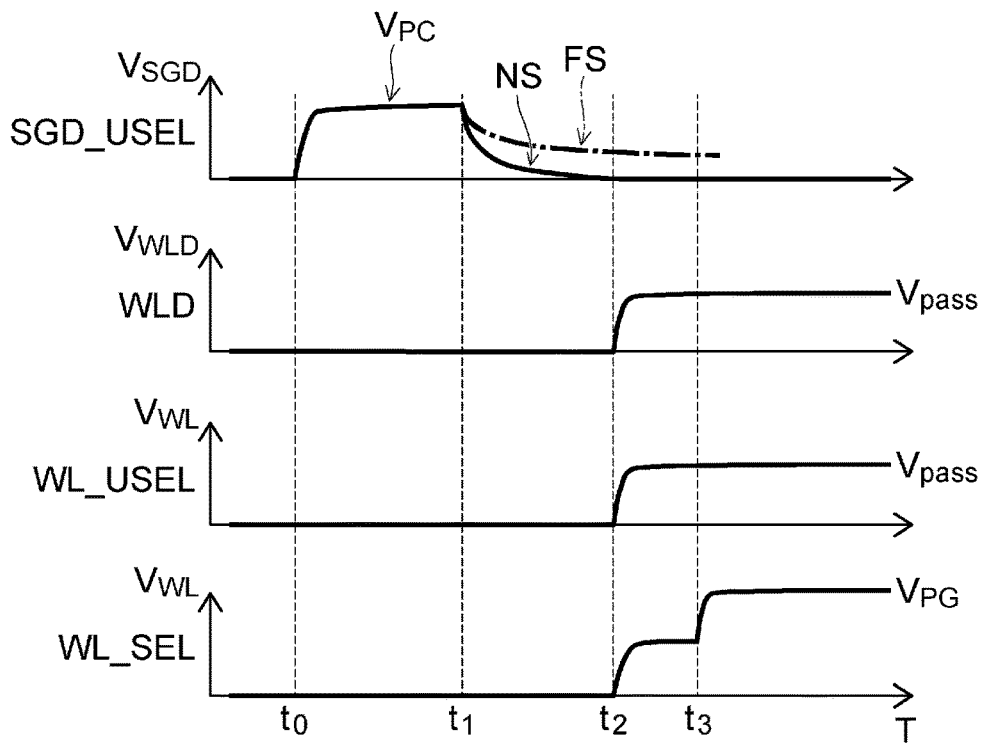

FIGS. 4A and 4B are time charts illustrating operation of the memory device 1 according to the embodiment. FIGS. 4A and 4B illustrate biases supplied from the drive circuits WD1, WD2, and GD1 to the electrode layers when data is written to one memory cell MC.

A select gate SGD_SEL shown in FIG. 4A is, for example, the SGDA shown in FIG. 1, and a select gate SGD_USEL shown in FIG. 4B is, for example, the SGDB shown in FIG. 1. In the following description, it is assumed that the select gate SGDA is the selected select gate SGD_SEL and that the select gate SGDB is the unselected select gate SGD_USEL.

FIGS. 4A and 4B illustrate biases $V_{SGD}$, $V_{WLD}$, and $V_{WL}$ supplied to the select gates SGD_SEL and SGD_USEL, and the word lines WL and the dummy word lines WLD located below the select gates SGD_SEL and SGD_USEL when data is written to the memory cell MC. It is noted that the same bias $V_{WLD}$ is supplied to the dummy word lines WLD0 and WLD1. In the following description, the dummy word lines WLD0 and WLD1 are collectively expressed as "dummy word lines WLD". FIG. 4A also illustrates a bias $V_{BL}$ supplied to unselected bit lines BL_USEL.

As shown in FIGS. 4A and 4B, from time $t_0$ to $t_1$, a bias $V_{PC}$ is supplied to the select gates SGD_SEL and SGD_USEL. The select transistors STD are thereby turned on. On the other hand, a bias $V_{DD}$ is supplied to the bit lines BL_USEL. A bias of the selected bit line BL (not shown) is 0 V. At this time, the source-side select transistor STS is turned off. As a result, the semiconductor pillars SP connected to the unselected bit lines BL_USEL charge-up to a potential $V_{DD}$.

It means herein that the selected bit line BL is the bit line BL connected to the semiconductor pillar SP that includes the memory cell MC to which data is to be written, while the unselected bit lines BL_USEL are the bit lines BL connected to the semiconductor pillars SP that do not include the memory cell MC to which data is to be written. The same thing is true for other elements.

At the time $t_1$, supply of the bias $V_{PC}$ to the select gates SGD_SEL and SGD_USEL is stopped. Owing to this, the bias $V_{SGD}$ of each of the select gates SGD_SEL and SGD_USEL decreases at an attenuation factor determined by a time constant CR resulting from a parasitic resistance and a parasitic capacitance of the select gate SGD_SEL or SGD_USEL.

As shown in FIGS. 4A and 4B, the potential $V_{SGD}$ of the select gates SGD_SEL and SGD_USEL decreases on a near side NS closer to the drive circuit GD1 and becomes 0 Vat, for example, time $t_2$. On the other hand, a decrease in the potential $V_{SGD}$ is slower on a far side FS of the string of select transistor STD far from the drive circuit GD1 because of an increase in the time constant CR. For example, in some cases, the potential VSGD does not decrease down to 0 V within a data write cycle.

Next, as shown in FIG. 4A, at the time $t_2$, a bias $V_{SON}$ is supplied to the select gate SGD_SEL. At this time, the potential of the selected bit line BL is 0 V and the selected cell transistor STD provided in the semiconductor pillar SP including the memory cell MC to which data is to be written is turned on. On the other hand, a bias $V_{DD}$ is supplied to the bit lines BL_USEL. Owing to this, the select transistor STD provided in the semiconductor pillars SP that do not include the memory cell MC to which data is to be written are turned off.

Moreover, a bias is not supplied to the select gate SGD_USEL shown in FIG. 4B from the drive circuit GD1 and yet the potential of the bit lines BL_USEL is $V_{DD}$; thus, the select transistor STD including the select gate SGD_USEL is turned off. As a result, the select transistors STS and STD are turned off in the semiconductor pillars SP_USEL other than the semiconductor pillar SP_SEL including the memory cell MC to which data is to be written and the semiconductor pillars SP_USEL have a floating potential.

On the other hand, at the time $t_2$, a bias $V_{PASS}$ is supplied to the word lines WL and the dummy word lines WLD. A channel of each memory cell MC is thereby turned on. Moreover, at time $t_3$, a bias $V_{PG}$ is supplied to the selected word line WL_SEL. It is thereby possible to write data to the memory cell MC to which data is to be written.

On the other hand, potentials of the semiconductor pillars SP_USEL that do not include the memory cell MC to which data is to be written are boosted in response to the bias supplied to each word line WL; thus, a potential difference narrows between, for example, the semiconductor pillar SP_USEL and the word line WL_SEL to which the bias $V_{PG}$ is supplied. It is thereby possible to prevent data from being erroneously written to unselected memory cells MC.

It is noted that the write potential $V_{PG}$ is not supplied to the dummy word lines WLD0 and WLD1. In other words, the drive circuit WD1 that supplies the bias to each word line WL is configured to be able to supply the higher bias than the bias supplied by the drive circuit WD2 to the dummy word lines WLD0 and WLD1 (refer to FIG. 3). The bias $V_{PG}$ exceeds, for example, 10 V. By contrast, the bias $V_{PASS}$ supplied to the dummy word lines WLD is, for example, a few volts.

Figure 5A:
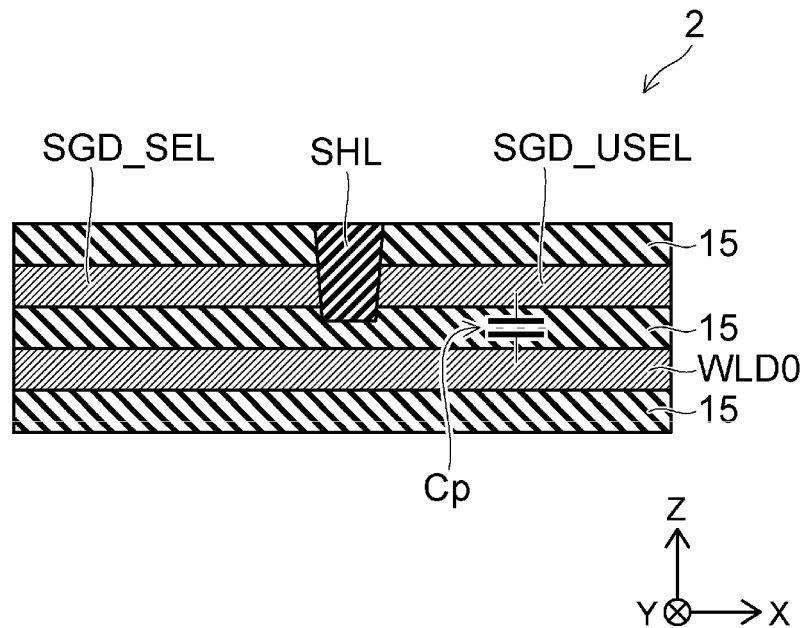
FIGS. 5A and 5B are schematic diagrams illustrating operation of a memory device according to a comparison.
Figure 5B:
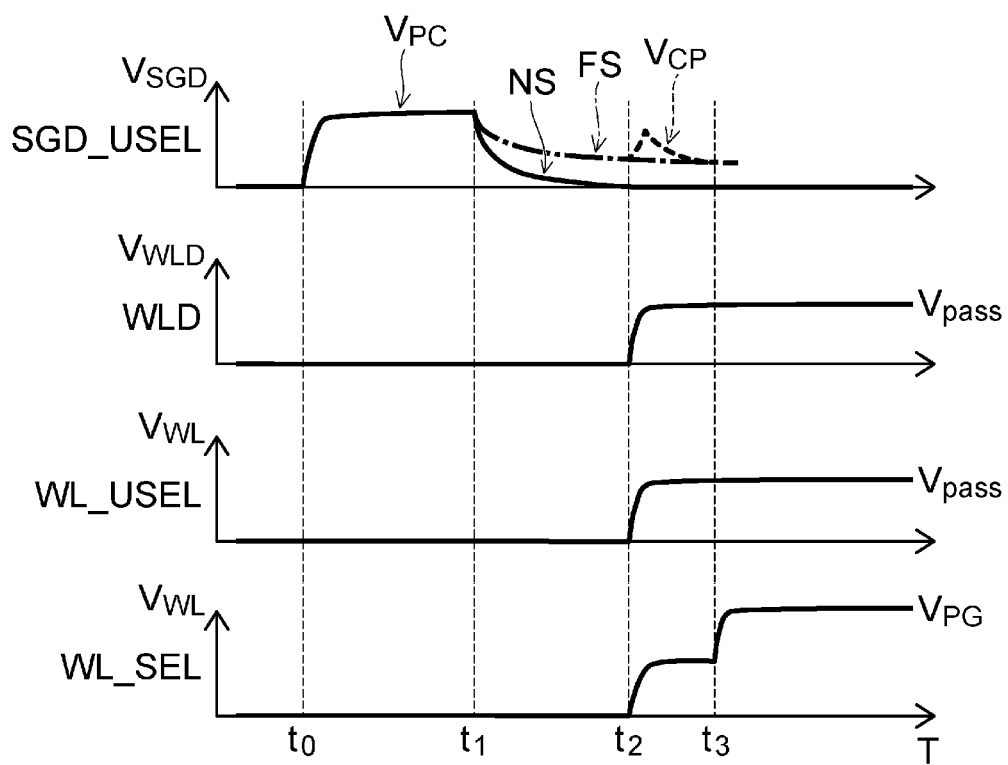

FIGS. 5A and 5B are schematic diagrams illustrating operation of a memory device 2 according to a comparison. FIG. 5A is a schematic cross-sectional view illustrating a structure of the memory device 2. FIG. 5B is a time chart illustrating the operation of the memory device 2.

As shown in FIG. 5A, in the memory device 2, the interlayer insulating film 15 is provided between the select gate SGD and the dummy word line WLD0. In other words, a thickness of the insulating film provided between the select gate SGD and the dummy word line WLD0 in the Z direction is generally identical to the thickness of the interlayer insulating films 15 provided between the word lines WL in the Z direction.

As shown in FIG. 5B, the bias $V_{PC}$ is supplied to the select gate SGD_USEL when data is written to one memory cell MC, and supply of the bias $V_{PC}$ is stopped at the time $t_1$. Subsequently, the potential of the select gate SGD_USEL gradually decreases.

Next, at the time $t_2$, the bias $V_{PASS}$ is supplied to the word lines WL and the dummy word lines WLD. At this time, an induced potential $V_{CP}$ is induced to the select gate SGD_USEL by coupling via a parasitic capacitance Cp between the select gate SGD_USEL and the dummy word line WLD; thus, the potential of the select gate SGD_USEL increases.

For example, on the far side FS of the select transistor STD far from the drive circuit GD1, the potential of the select gate SGD_USEL does not completely decrease from $V_{PC}$ and the induced potential $V_{CP}$ is superimposed on the potential. Owing to this, portions of the select transistors STD are turned on, which often causes suppression of boosting of the potentials in the semiconductor pillars SP. As a result, a malfunction possibly occurs that data is written to the unselected memory cells MC.

In the memory device 1 according to the present embodiment, by contrast, the interlayer insulating film 15M is provided between the select gate SGD and the dummy word line WLD0. The interlayer insulating film 15M is formed thicker than the interlayer insulating films 15 provided between the word lines WL in the Z direction. Owing to this, the parasitic capacitance Cp between the select gate SGD and the dummy word line WLD0 is decreased, and thus, parasitic coupling is prevented. It is thereby possible to prevent data from being erroneously written to the unselected memory cells MC.

A method of manufacturing the memory device 1 according to the embodiment will next be described with reference to FIGS. 6A to 9B. FIGS. 6A to 9B are schematic cross-sectional views illustrating procedures of manufacturing the memory device 1.

Figure 6A:
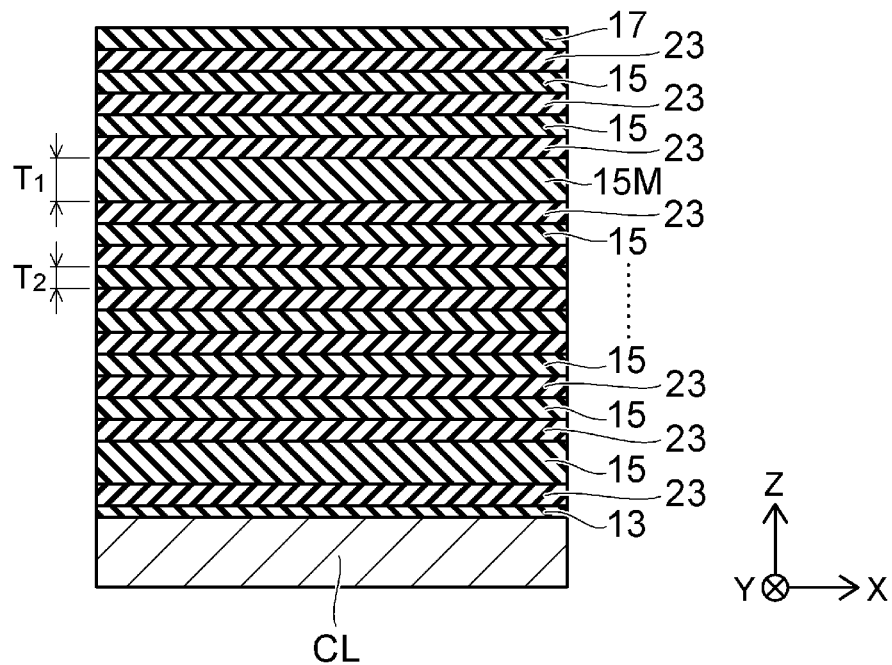
FIGS. 6A and 6B are schematic diagrams illustrating procedures of manufacturing the memory device according to the embodiment.

As shown in FIG. 6A, the interlayer insulating films 13, 15, and 17 and sacrificial films 23 are stacked on the conductive layer CL. A sacrificial film 23 is provided between each two interlayer insulating films 13, 15, and 17 adjacent to each other in the Z direction. The interlayer insulating film 13 is provided between the conductive layer CL and the lowermost sacrificial film 23 among the plurality of sacrificial films 23. The interlayer insulating film 17 is provided on the uppermost sacrificial film 23 among the plurality of sacrificial films 23. The interlayer insulating films 13, 15, and 17 are, for example, silicon oxide films. The sacrificial films 23 are, for example, silicon nitride films.

For example, the interlayer insulating films 15 include the interlayer insulating film 15M. The interlayer insulating film 15M is formed so that the thickness $T_1$ thereof in the Z direction is larger than the thickness $T_2$ of the other interlayer insulating films 15 in the Z direction. The thickness $T_1$ is, for example, 1.5 to 3.0 times as large as the thickness $T_2$.

Figure 6B:
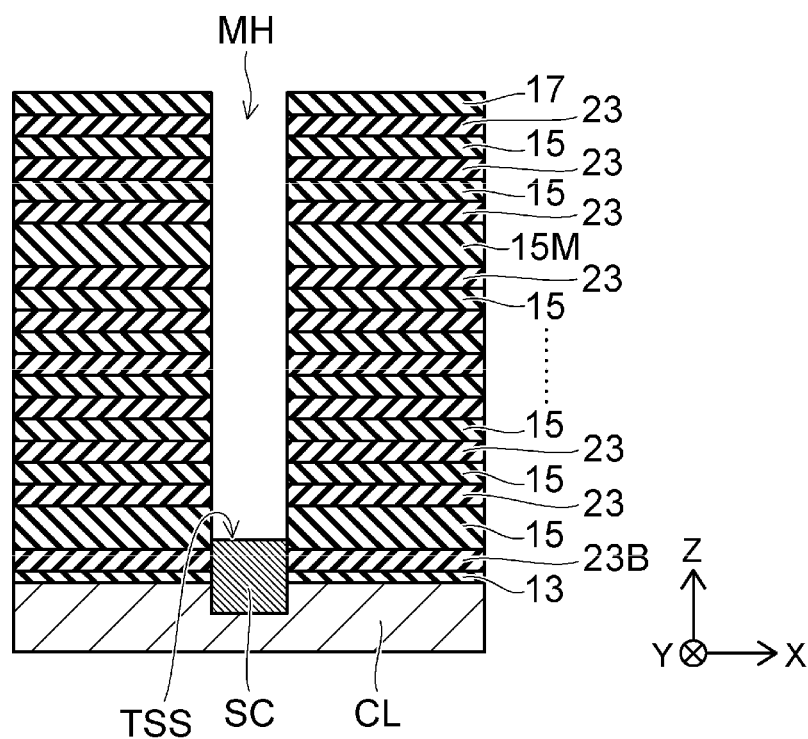

As shown in FIG. 6B, a memory hole MH having a depth extending from an upper surface of the interlayer insulating film 17 to the conductive layer CL is formed. The memory hole MH is formed to have, for example, a circular, elliptical, or polygonal opening on the upper surface of the interlayer insulating film 17.

Subsequently, the semiconductor layer SC is formed on a bottom portion of the memory hole MH. For example, the conductive layer CL is a silicon layer. The semiconductor layer SC is a polysilicon layer using, for example, CVD (Chemical Vapor Deposition), and is formed so as not to be deposited on the interlayer insulating films 13, 15, and 17 exposed to a side wall of the memory hole MH, but to be selectively deposited on the conductive layer CL. In addition, the semiconductor layer SC is formed so that an upper surface TSS thereof is located, for example, on a level between the lowermost sacrificial film 23 and the sacrificial film 23 located over the lowermost sacrificial film 23.

Figure 7A:
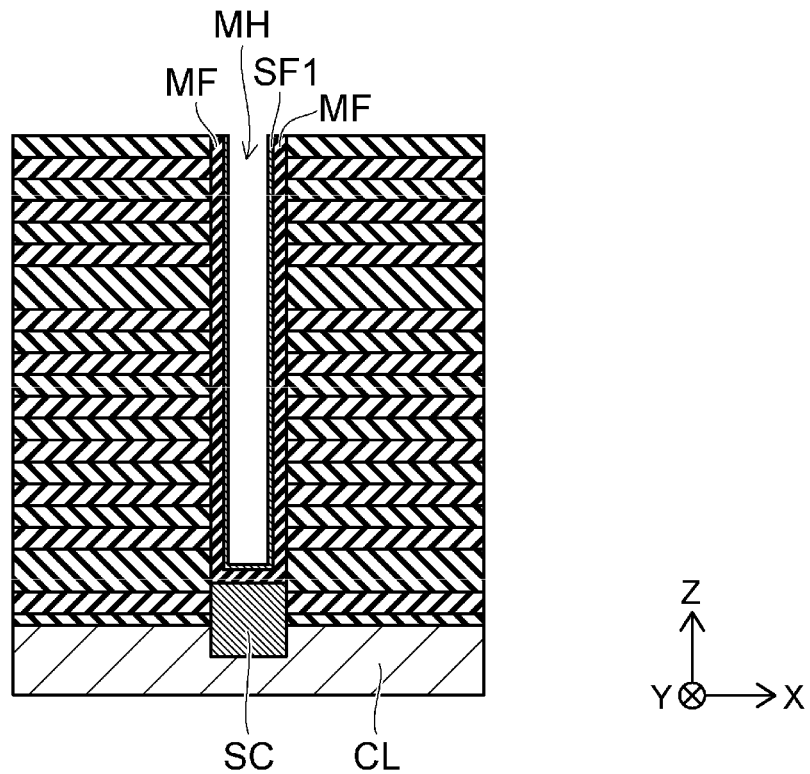
FIGS. 7A and 7B are schematic diagrams illustrating procedures, subsequent to those of FIGS. 6A and 6B, of manufacturing the memory device according to the embodiment.

As shown in FIG. 7A, the memory film MF and a semiconductor film SF1 are formed within the memory hole MH. The memory film MF has a stacked structure shown in, for example, FIG. 2. The memory film MF is formed in contact with an upper surface of the semiconductor layer SC on a bottom surface of the memory hole MH. The semiconductor film SF1 is, for example, an amorphous silicon film. The memory film MF and the semiconductor film SF1 are formed to have thicknesses such that a space remains within the memory hole MH.

Figure 7B:
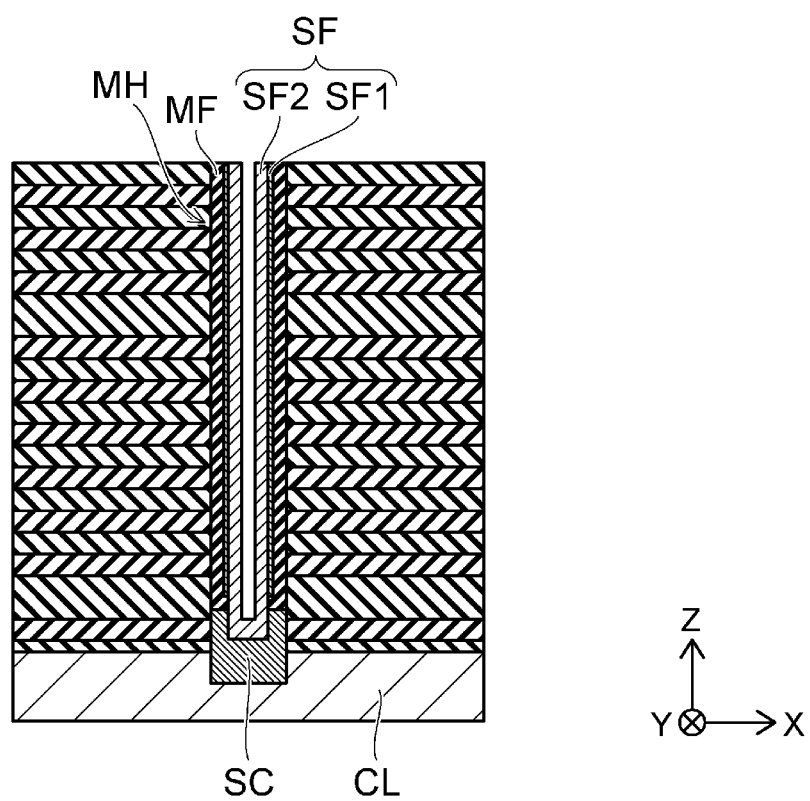

As shown in FIG. 7B, a semiconductor film SF2 that covers an inner surface of the memory hole MH is formed. Prior thereto, part of the semiconductor film SF1 and part of the memory film MF stacked on the bottom surface of the memory hole MH are selectively removed by, for example, anisotropic RIE (Reactive Ion Etching). During this etching, the semiconductor film SF1 protects the memory film MF remaining on the inner wall of the memory hole MH from being removed by etching.

Subsequently, a semiconductor film SF2 that covers the inner surface of the memory hole MH is formed. The semiconductor film SF2 is, for example, an amorphous silicon film and formed to have a thickness such that a space remains within the memory hole MH. Moreover, the semiconductor films SF1 and SF2 are crystallized by a heat treatment, thereby forming the semiconductor film SF. The resulting semiconductor film SF is, for example, a polysilicon film.

As shown in FIG. 8A, an insulator is buried within the memory hole MH to form the insulating core IC. The insulating core IC is, for example, silicon oxide formed by the CVD. Next, a slit ST is formed to divide the interlayer insulating films 13, 15, and 17, and the sacrificial films 23 and it extends to the conductive layer CL. The slit ST has a thickness, for example, from the upper surface of the interlayer insulating film 17 to the conductive layer CL and extends in the Y direction.

As shown in FIG. 8B, the sacrificial films 23 are selectively removed via the slit ST. The sacrificial films 23 are removed by, for example, wet etching which leaves the interlayer insulating films 13, 15, and 17 unremoved. At this time, the memory film MF, the semiconductor film SF, and the insulating core IC formed within the memory hole MH support the interlayer insulating films 13, 15 and 17 and spaces 23S are maintained after removal of the sacrificial films 23.

Figure 9A:
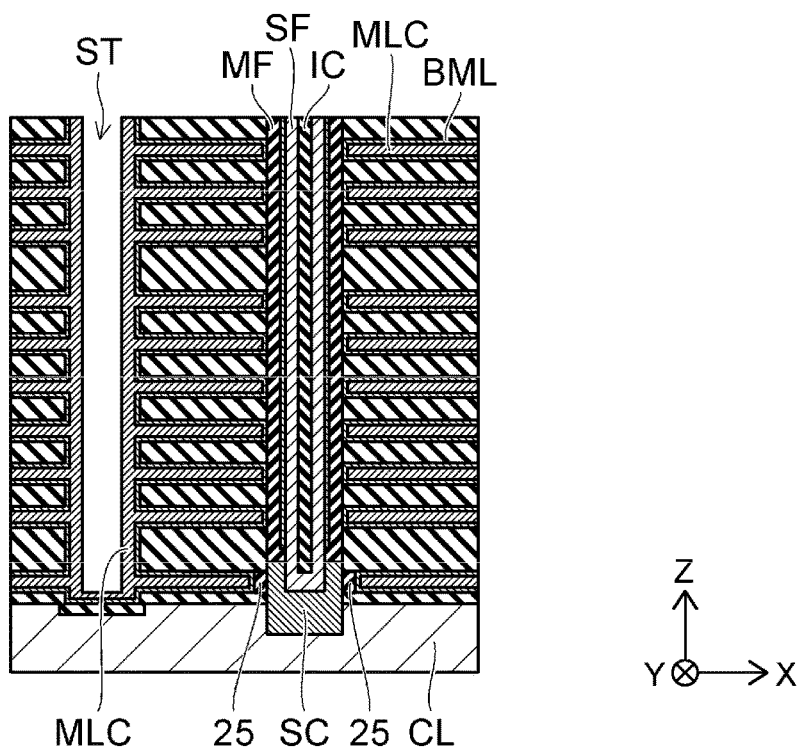
FIGS. 9A and 9B are schematic diagrams illustrating procedures, subsequent to those of FIGS. 8A and 8B, of manufacturing the memory device according to the embodiment.

As shown in FIG. 9A, the insulating film 25 is formed on a surface of the semiconductor layer SC via the slit ST and the spaces 23S. The insulating film 25 is, for example, a silicon oxide film formed by subjecting the semiconductor layer SC to thermal oxidation.

Subsequently, barrier metal layers BML and core metal layers MLC are formed within the spaces 23S. The barrier metal layers BML contain, for example, titanium nitride (TiN). In addition, the core metal layers MLC contain, for example, tungsten (W). The barrier metal layers BML and the core metal layers MLC are deposited by, for example, using the CVD method via the slit ST.

Figure 9B:
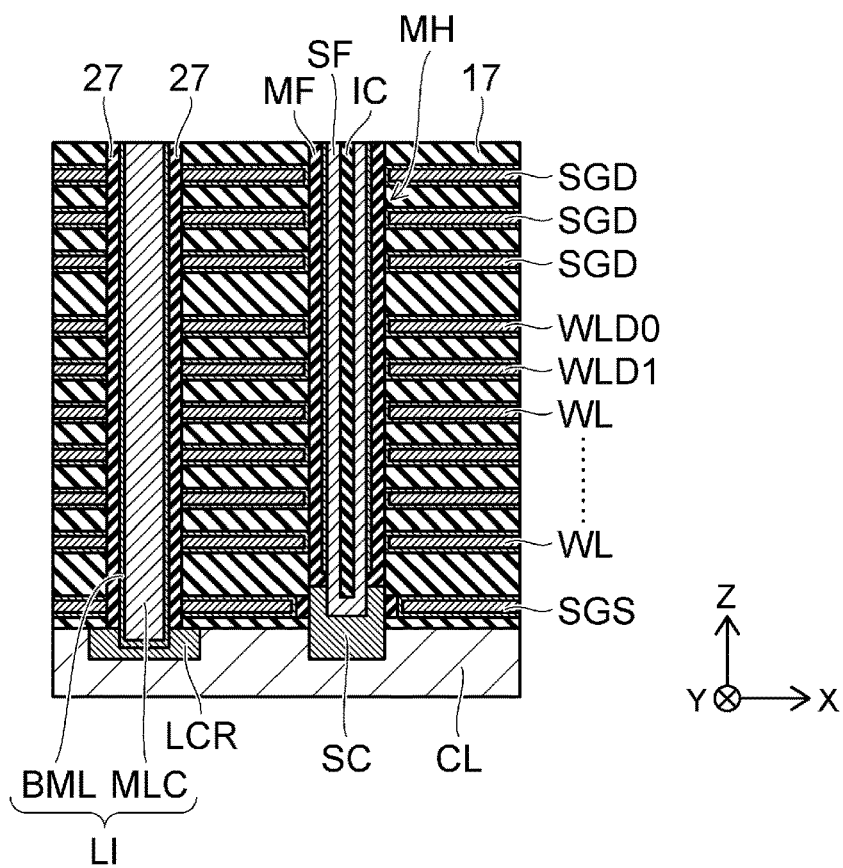

As shown in FIG. 9B, the connection conductor LI and an insulating film 27 are formed within the slit ST. Specifically, the barrier metal layer BML and the core metal layer MLC that cover an inner surface of the slit ST are removed by, for example, using isotropic dry etching thereof, and the insulating film 27 that covers the inner surface of the slit ST is then formed. Moreover, N-type impurity ions are implanted into the conductive layer CL via the slit ST to form a contact region LCR. Next, the part of the insulating film 27 that covers a bottom surface of the slit ST is selectively removed, and the barrier metal layer BML that covers the inner surface of the slit ST and the core metal layer MLC filling the remaining portion of the interior of the slit ST are then formed. It is thereby possible to form the connection conductor LI within the slit ST.

Subsequently, interlayer insulating films 19 and 21, the connection plugs CH and V1, and the bit lines BL are formed on the interlayer insulating film 17; thus, the memory cell array is completed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
a plurality of word lines spaced from one another in a first direction;
a first insulating film provided between the word lines adjacent to each other in the first direction;
a plurality of select gates located above the plurality of word lines in the first direction;
a first dummy word line provided between the plurality of word lines and the select gates;
a second dummy word line provided between the first dummy word line and the select gates, the second dummy word line being connected to the first dummy word line;
a second insulating film provided between the second dummy word line and the select gates;
a semiconductor pillar extending through the plurality of word lines, the first insulating film, the first dummy word line, the second dummy word line, the second insulating film, and the select gates, and extending in the first direction; and
a charge retention film located between the plurality of word lines and the semiconductor pillar, wherein
the second insulating film has a second thickness in the first direction that is greater than or equal to 1.5 times a first thickness of the first insulating film in the first direction and less than or equal to 3 times the first thickness of the first insulating film in the first direction.

2. The memory device according to claim 1, further comprising a third insulating film having a third thickness, less than the second thickness, located between the plurality of select gates in the first direction.

3. The memory device according to claim 2, wherein the third thickness is equal to the first thickness.

4. The memory device according to claim 1, further comprising a bit line extending in a second direction crossing the first direction, wherein the plurality of select gates are located between the bit line and the first dummy word line, and wherein the word lines extend in a third direction, crossing the first and the second directions.

5. The memory device according to claim 1, further comprising:
   a first drive circuit connected to each of the plurality of word lines and configured to supply a second bias thereto; and
   a second drive circuit connected to the first and second dummy word lines and configured to supply a first bias thereto, wherein
   the potential of the second bias is greater than the potential of the first bias.

6. The memory device according to claim 5, wherein the second potential to one of the plurality of word lines causes charge injection to occur from the semiconductor pillar into an adjacent portion of the charge retention film.

7. The memory device according to claim 3, further comprising:
   a fourth insulating film located between the first dummy word line and the second dummy word line, the fourth insulating film having a fourth thickness less than the second thickness.

8. The memory device according to claim 7, wherein the fourth thickness is equal to the first thickness.

9. A memory device comprising;
   a plurality of word lines, each of the word lines electrically connected to at least one memory cell, the word lines spaced from one another by a first distance in a first direction and extending in a second direction crossing the first direction;
   a first gate layer extending in the second direction, and spaced from one of the word lines nearest thereto by a second distance in the first direction;
   a second gate layer extending in the second direction, and spaced from the plurality of word lines in the first direction, a plurality of memory cells interposed between the second gate layer and the first gate layer;
   a first dummy word line extending in the second direction, and spaced from the plurality of word lines in the first direction by the first distance; and
   a second dummy word line extending in the second direction, and spaced from the first dummy word line in the first direction by the first distance, the first and second dummy word lines being between the second gate layer and the plurality of word lines and connected to each other, wherein the second gate layer is spaced from the second dummy word line in the first direction by a third distance that is greater than or equal to 1.5 times the first distance and less than or equal to 3 times the first distance.

10. The memory device according to claim 9, wherein the second distance is greater than the first distance.

11. The memory device according to claim 9, further comprising a semiconductor pillar extending through at least one memory cell in the plurality of word lines.

12. The memory device according to claim 11, wherein a memory cell in the word lines comprises a charge retention film located in one of the plurality of word lines.

13. The memory device according to claim 9, further comprising:
   a first insulating layer interposed between each two word lines in the first direction, between the first dummy word line and the plurality of word lines, and between the first dummy word line and the second dummy word line; and
   a second insulating layer interposed between the second gate layer and the second dummy word line, wherein
   a thickness of the second insulating layer is greater in the first direction than a thickness of the first insulating layer in the first direction.

* * * * *